United States Patent
Kashiwagi et al.

(10) Patent No.: US 8,057,906 B2
(45) Date of Patent: Nov. 15, 2011

(54) METHOD OF REDUCING SURFACE TACKINESS OF SILICONE RUBBER CURED PRODUCT, LIQUID SILICONE RUBBER COMPOSITION FOR SEALING SEMICONDUCTOR, SILICONE RUBBER-SEALED SEMICONDUCTOR DEVICE, AND METHOD OF PRODUCING SEMICONDUCTOR DEVICE

(75) Inventors: Tsutomu Kashiwagi, Annaka (JP); Toshio Shiobara, Annaka (JP); Masanobu Sato, Tokushima (JP); Koki Matsumoto, Komatsushima (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 565 days.

(21) Appl. No.: 11/529,312

(22) Filed: Sep. 29, 2006

(65) Prior Publication Data

US 2007/0077360 A1    Apr. 5, 2007

(30) Foreign Application Priority Data

Sep. 30, 2005   (JP) .................. 2005-288916

(51) Int. Cl.
*B32B 9/04* (2006.01)
(52) U.S. Cl. ......... 428/447; 525/100; 525/478; 525/479
(58) Field of Classification Search .................. 428/447
See application file for complete search history.

(56) References Cited

U.S. PATENT DOCUMENTS

| | | | | |
|---|---|---|---|---|
| 3,284,406 A | * | 11/1966 | Nelson | 528/31 |
| 3,485,662 A | * | 12/1969 | Metevia | 427/140 |
| 4,448,815 A | * | 5/1984 | Grenoble et al. | 427/387 |
| 4,780,260 A | * | 10/1988 | Yoshida et al. | 264/255 |
| 5,019,419 A | * | 5/1991 | Matsumoto et al. | 427/96.2 |
| 5,279,890 A | * | 1/1994 | Ikeno et al. | 428/217 |
| 5,561,329 A | * | 10/1996 | Mine et al. | 257/788 |
| 5,599,894 A | | 2/1997 | Ikeno | |
| 5,645,941 A | | 7/1997 | Meguriya et al. | |
| 7,501,183 B2 | * | 3/2009 | Hara et al. | 428/447 |
| 7,763,185 B2 | * | 7/2010 | Chan et al. | 252/500 |
| 2007/0134425 A1 | | 6/2007 | Morita et al. | |

FOREIGN PATENT DOCUMENTS

| | | | |
|---|---|---|---|
| EP | 0 431 979 A2 | | 6/1991 |
| EP | 0 799 693 A2 | | 10/1997 |
| JP | 3-178433 | | 8/1991 |
| JP | 8-53622 | | 2/1996 |
| JP | 10330622 | * | 12/1998 |
| JP | 2004-133286 | | 4/2004 |
| JP | 2004107577 A | * | 4/2004 |
| JP | 2005-161132 | | 6/2005 |
| JP | 2006-30801 | | 2/2006 |
| JP | 2006137787 A | * | 6/2006 |
| WO | WO 00/06512 | * | 7/1999 |

* cited by examiner

*Primary Examiner* — Randy Gulakowski
*Assistant Examiner* — Lindsay Nelson
(74) *Attorney, Agent, or Firm* — Oblon, Spivak, McClelland, Maier & Neustadt, L.L.P.

(57) ABSTRACT

A method of reducing surface tackiness of a silicone rubber cured product is provided. The method includes coating the surface of a cured product of a curable silicone rubber composition, which has a molar ratio within the composition of hydrogen atoms bonded to silicon atoms relative to alkenyl groups bonded to silicon atoms of 1.0 or greater, and which, following curing, exhibits a type A hardness prescribed in JIS K6253 of no more than 20, with a curable silicone resin layer which, following curing, exhibits a type D hardness prescribed in JIS K6253 of 30 or greater; and subsequently curing the silicone resin to form a cured resin layer with a thickness of no more than 0.5 mm. Adhesion of dirt to the surface can be prevented.

22 Claims, 1 Drawing Sheet

METHOD OF REDUCING SURFACE TACKINESS OF SILICONE RUBBER CURED PRODUCT, LIQUID SILICONE RUBBER COMPOSITION FOR SEALING SEMICONDUCTOR, SILICONE RUBBER-SEALED SEMICONDUCTOR DEVICE, AND METHOD OF PRODUCING SEMICONDUCTOR DEVICE

BACKGROUND OF THE INVENTION

1. Field of the Invention

The present invention relates to a method of reducing the surface tackiness of a silicone rubber cured product, an addition reaction curable liquid silicone rubber composition for sealing semiconductors, and applications of that composition. In other words, the invention relates to applications such as a silicone rubber-sealed semiconductor device that uses the above composition as a sealing material for a semiconductor element, and a method of producing such a device.

2. Description of the Prior Art

Silicone rubber compositions form cured products that exhibit excellent properties of weather resistance and heat resistance, and excellent rubber-like characteristics such as hardness and elongation, and are consequently used in all manner of applications. Furthermore, because excellent heat resistance and light resistance can be achieved by coating a target product with a silicone rubber, silicone rubbers are also being investigated as potential materials for all manner of packages.

The sealing (molding) of semiconductor elements using silicone cured products is already being conducted, but amongst the various possible silicone cured products, hard resins tend to be prone to cracking or bonding wire deformation problems, whereas soft rubbers exhibit surface tackiness, meaning they tend to be prone to dirt adhesion, and also suffer frequently from adhesion of the sealing resin (the molding resin) within the parts feeder. A common countermeasure to these problems is a method in which a soft rubber or gel is used as an inner material, and the exterior of this inner material is then coated with a hard rubber or hard resin (patent reference 1). However, in this method, because the soft rubber or soft gel usually retains small quantities of residual vinyl groups within the cured polymer, it tends to be affected by the exterior hard rubber or hard resin, meaning the inner soft rubber or gel gradually hardens over time, increasing the likelihood of bonding wire breakage or deformation.

[Patent Reference 1]
U.S. Pat. No. 5,279,890

SUMMARY OF THE INVENTION

Accordingly, an object of the present invention is to provide a method of reducing the surface tackiness of a soft rubber-type silicone cured product, while ensuring favorable stability of the elastomer characteristics of the cured product over an extended period of time.

Furthermore, another object of the present invention is to provide a curable liquid silicone rubber composition that is ideal for the above method, as well as a silicone rubber-sealed semiconductor device that uses such a composition, and a method of producing such a semiconductor device.

As a result of intensive research, the inventors of the present invention discovered that by using a specific addition reaction curable liquid silicone rubber composition, in which the balance of silicon atom-bonded hydrogen atoms (Si—H) that contribute to cross-linking in a soft rubber/silicon atom-bonded alkenyl groups represents a SiH excess, and which yields a cured product following curing with a predetermined type A hardness, and by then coating the surface of this soft rubber with a hard silicone resin with a predetermined hardness, the above objects could be achieved, and they were thus able to complete the present invention.

A first aspect of the present invention provides a method of reducing the surface tackiness of a silicone rubber cured product, comprising the steps of:

coating the surface of a cured product of a curable liquid silicone rubber composition, which has a molar ratio within the composition of hydrogen atoms bonded to silicon atoms relative to alkenyl groups bonded to silicon atoms of 1.0 or greater, and which, following curing, exhibits a type A hardness prescribed in JIS K6253 of no more than 20, with a curable silicone resin which, following curing, exhibits a type D hardness prescribed in JIS K6253 of 30 or greater; and subsequently curing the silicone resin to form a cured silicone resin layer with a thickness of no more than 0.5 mm.

A second aspect of the present invention provides an addition reaction curable liquid silicone rubber composition for sealing a semiconductor, which is ideal as the soft silicone rubber-forming composition described in the first aspect, and comprises:

(A) an organopolysiloxane containing two alkenyl groups bonded to silicon atoms within each molecule, (B) an organopolysiloxane containing three or more alkenyl groups bonded to silicon atoms within each molecule, (C) an organohydrogenpolysiloxane containing two hydrogen atoms bonded to silicon atoms within each molecule, and (D) a platinum group metal-based catalyst, wherein the composition has a molar ratio of hydrogen atoms bonded to silicon atoms relative to alkenyl groups bonded to silicon atoms of 1.0 or greater, and following curing exhibits a type A hardness prescribed in JIS K6253 of no more than 20.

A third aspect of the present invention provides a silicone rubber-sealed semiconductor device, comprising a semiconductor element, and a sealing body that seals the semiconductor element, wherein the sealing body comprises a first sealing member that coats the semiconductor element, and a second sealing member that coats the first sealing member, the first sealing member comprises a cured product of a curable silicone rubber composition, which has a molar ratio of hydrogen atoms bonded to silicon atoms relative to alkenyl groups bonded to silicon atoms of 1.0 or greater, and which, following curing, exhibits a type A hardness prescribed in JIS K6253 of no more than 20, and the second sealing member comprises a curable silicone resin layer, which exhibits a type D hardness prescribed in JIS K6253 of 30 or greater, and has a thickness of no more than 0.5 mm.

A fourth aspect of the present invention provides the above silicone rubber-sealed semiconductor device, wherein the curable silicone rubber composition used is the addition reaction curable liquid silicone rubber composition for sealing a semiconductor described above.

A fifth aspect of the present invention provides a method of producing a silicone rubber-sealed semiconductor device with reduced surface tackiness, comprising the steps of:

sealing a semiconductor element with a cured product of the addition reaction curable liquid silicone rubber composition defined above in the second aspect, applying a curable silicone resin, which following curing exhibits a type D hardness prescribed in JIS K6253 of 30 or greater, to the surface of the cured product formed for sealing purposes, and curing the applied coating of the curable silicone resin, thereby forming a cured silicone resin layer with a thickness of no more than 0.5 mm.

According to the method of reducing surface tackiness of the present invention, the tackiness of the surface of a silicone rubber cured product can be effectively suppressed, and adhesion of dirt to the surface can be prevented, while the occurrence of peeling or cracking of the hard resin coating layer is also effectively suppressed. This method is useful for semiconductor element sealing processes and the like.

An addition reaction curable liquid silicone rubber composition of the present invention is not only ideal for use in the aforementioned method of reducing surface tackiness, but also yields a cured product with excellent transparency and extremely favorable adhesion to package materials such as LCPs and metal substrates, meaning it is useful as a semiconductor element sealing material, and can be used for producing highly reliable silicone rubber-sealed semiconductor devices. Furthermore, reducing the surface tackiness of a silicone rubber cured product using the present invention can be widely used in all manner of general purpose applications, including semiconductor packages such as photodiodes, CCD and CMOS that require favorable transparency and low stress properties.

DETAILED DESCRIPTION OF THE PREFERRED EMBODIMENTS

Figure 1:
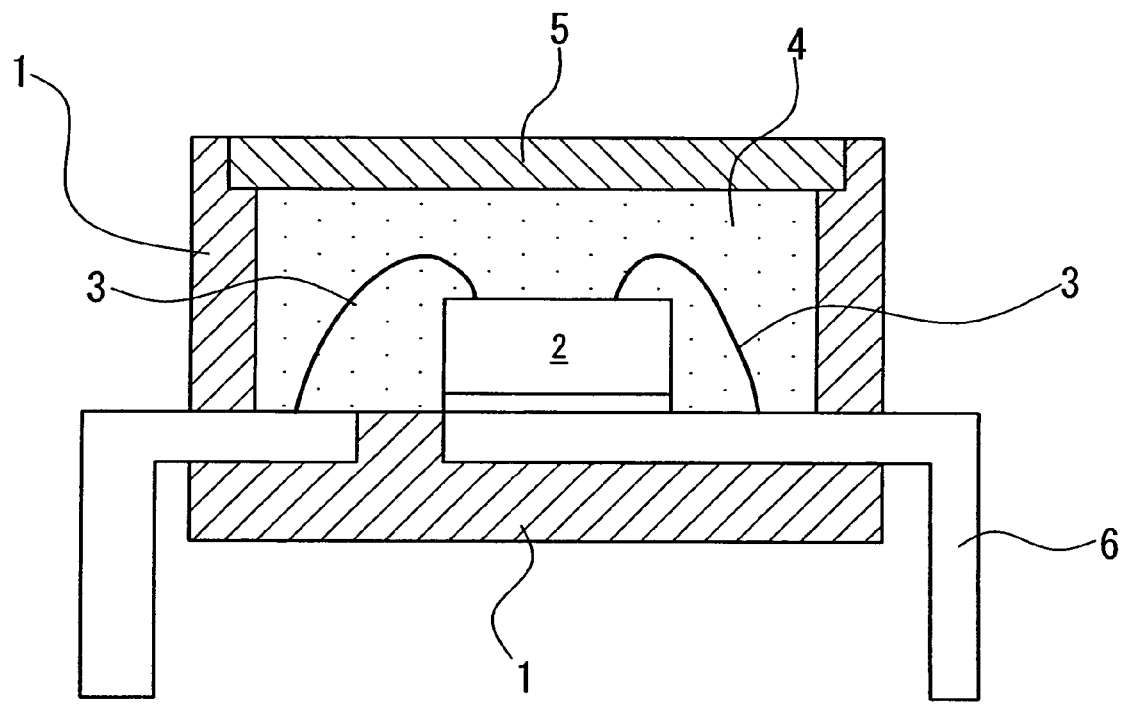
FIG. 1 illustrates a longitudinal cross-sectional view showing a CCD package in which a semiconductor chip has been sealed.

In the following description, and in the description of the claims, the term "type A hardness" refers to the hardness measured using a type A durometer prescribed in JIS K6253, whereas the term "type D hardness" refers to the hardness measured using a type D durometer prescribed in JIS K6253.

[Method of Reducing Surface Tackiness]

A method of reducing surface tackiness according to the present invention comprises the steps of coating the surface of a cured product of a curable silicone rubber composition, which has a molar ratio within the composition of hydrogen atoms bonded to silicon atoms relative to alkenyl groups bonded to silicon atoms (hereafter, abbreviated as the "Si—H/Si-alkenyl molar ratio") of 1.0 or greater and exhibits a type A hardness of no more than 20, with a curable silicone resin which, following curing, exhibits a type D hardness of 30 or greater, and subsequently curing the silicone resin to form a cured silicone resin layer with a thickness of no more than 0.5 mm.

In this method of the present invention, any addition reaction curable silicone rubber composition for which (i) the Si—H/Si-alkenyl molar ratio within the composition is 1.0 or greater, and preferably within a range from 1.0 to 4.0, even more preferably from 1.0 to 3.0, and most preferably from 1.0 to 2.0, and which forms (ii) a cured product surface which, following curing, exhibits a type A hardness of no more than 20, and preferably no more than 18 can be used as the composition for the base material that undergoes coating (the soft silicone rubber cured product). In such cases, there are no particular restrictions on the lower limit for the hardness, although typically, the type A hardness is at least 1, preferably 2 or greater, and even more preferably 5 or greater.

If the Si—H/Si-alkenyl molar ratio within the addition reaction curable silicone rubber composition is less than 1.0, then even if the surface of a cured product of the silicone rubber composition is coated with a cured product of a curable silicone resin (a hard silicone resin), the cross-linking agent of the curable silicone resin penetrates into the interior of the soft silicone rubber cured product, and as a result of reaction with residual alkenyl groups inside the silicone rubber cured product, the hardness of the soft silicone rubber cured product increases over time. If the type A hardness of the composition exceeds 20, then the danger of wire deformation or separation from the substrate increases significantly.

The curable silicone resin used can employ any silicone resin that following curing exhibits a surface type D hardness of 30 or greater, and preferably 40 or greater, and even more preferably 50 or greater. If this type D hardness is less than 30, then the surface tackiness of the molding resin increases. Although there are no particular restrictions on the upper limit for this hardness value, the type D hardness is typically no more than 90, and particularly 80 or less.

This method is useful for resolving the conventional technology problems associated with semiconductor sealing. In other words, when the aforementioned curable silicone rubber composition cured product (the soft silicone rubber) is a cured product that has been formed for the purposes of semiconductor sealing, the surface tackiness of the cured product can be decreased markedly, and problems that arise in semiconductor device production processes, such as the adhesion of dirt to the sealing material surface, or the adhesion of the molding resin to the parts feeder, can be effectively prevented.

An example of a composition that is particularly ideal as the addition reaction curable liquid silicone rubber composition that yields the soft silicone rubber used in the method of the present invention is the composition described below.

[Addition Reaction Curable Liquid Silicone Rubber Composition]

As described above, this composition comprises components (A) through (D) as essential components. As follows is a description of each of these components.

-(A) Alkenyl Group-Containing Organopolysiloxane 1-

This component (A) is an organopolysiloxane that contains two alkenyl groups bonded to silicon atoms within each molecule, and is the principal component (the base polymer) within the silicone rubber composition of the present invention.

This organopolysiloxane contains two silicon atom-bonded alkenyl groups of 2 to 8 carbon atoms, and particularly of 2 to 6 carbon atoms, such as vinyl groups or allyl groups, within each molecule. The viscosity at 25° C. is typically within a range from 10 to 1,000,000 mPa·s, and viscosity values within a range from 100 to 100,000 mPa·s offer particularly favorable workability and curability, and are consequently preferred.

Specific examples include straight-chain organopolysiloxanes represented by a general formula (1) shown below, in which the principal chain, which has a single alkenyl group bonded to the silicon atom at each molecular chain terminal, is formed from repeating diorganosiloxane units that contain no alkenyl groups, and both molecular chain terminals are blocked with triorganosiloxy groups, and as described above, compounds for which the viscosity at 25° C. is within a range from 10 to 1,000,000 mPa·s are preferred in terms of workability and curability. This straight-chain organopolysiloxane may also include a small quantity of branched structures (trifunctional siloxane units) within the molecular chain.

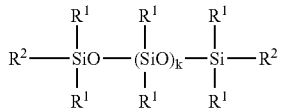
(1)

(wherein, each $R^1$ represents, independently, an identical or different unsubstituted or substituted monovalent hydrocarbon group that contains no aliphatic unsaturated bonds, $R^2$ represents an alkenyl group, and k represents 0 or a positive integer that yields a viscosity at 25° C. for the organopolysiloxane that falls within a range from 10 to 1,000,000 mPa·s)

In this description, the unsubstituted or substituted monovalent hydrocarbon group that contains no aliphatic unsaturated bonds represented by $R^1$ is preferably a group of 1 to 10, and even more preferably 1 to 6, carbon atoms, and specific examples of suitable groups include alkyl groups such as a methyl group, ethyl group, propyl group, isopropyl group, butyl group, isobutyl group, tert-butyl group, pentyl group, neopentyl group, hexyl group, cyclohexyl group, octyl group, nonyl group or decyl group, aryl groups such as a phenyl group, tolyl group, xylyl group or naphthyl group, aralkyl groups such as a benzyl group, phenylethyl group or phenylpropyl group, and groups in which either a portion of, or all of, the hydrogen atoms within these groups have been substituted with a halogen atom such as a fluorine, bromine or chlorine atom, or a cyano group or the like, including halogen-substituted alkyl groups such as a chloromethyl group, chloropropyl group, bromoethyl group or trifluoropropyl group, and a cyanoethyl group. The alkenyl group of $R^2$ is preferably a group of 2 to 6, and even more preferably 2 to 3, carbon atoms, and specific examples of suitable groups include a vinyl group, allyl group, propenyl group, isopropenyl group, butenyl group, isobutenyl group, hexenyl group or cyclohexenyl group, although a vinyl group is preferred.

In the general formula (1), k is typically either 0 or an positive integer that satisfies: $0 \leq k \leq 10,000$, and is preferably an integer that satisfies $5 \leq k \leq 2,000$, and even more preferably an integer that satisfies $10 \leq k \leq 1,200$.

Specific examples of the organopolysiloxane of the component (A) include the compounds shown below.

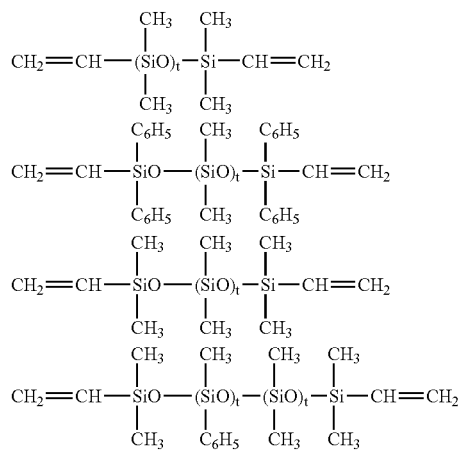

(In each formula, each t represents, independently, an integer within a range from 8 to 2,000.)

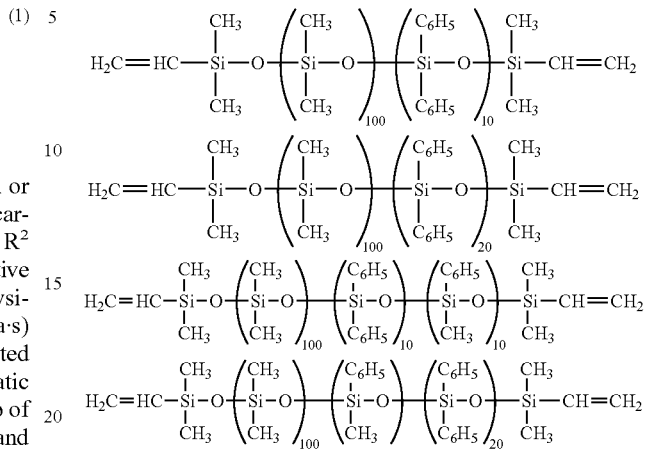

-(B) Alkenyl Group-Containing Organopolysiloxane 2-

The organopolysiloxane of the component (B) is an organopolysiloxane that contains 3 or more, and typically from 3 to 30, and preferably from approximately 3 to 20, silicon atom-bonded alkenyl groups of 2 to 8 carbon atoms, and particularly of 2 to 6 carbon atoms, such as vinyl groups or allyl groups, within each molecule. The molecular structure may be a straight-chain, cyclic, branched or three dimensional network structure. This component is preferably a straight-chain organopolysiloxane in which the principal chain is formed from repeating diorganosiloxane units, both molecular chain terminals are blocked with triorganosiloxy groups, and for which the viscosity at 25° C. is within a range from 10 to 1,000,000 mPa·s, and particularly from 100 to 100,000 mPa·s.

The alkenyl groups may be bonded to silicon atoms at the molecular chain terminals or to non-terminal silicon atoms (within the molecular chain), or both these types of alkenyl groups may exist within a single molecule. Of these possibilities, straight-chain organopolysiloxanes represented by a general formula (2) shown below, in which each molecular chain terminal silicon atom bears from 1 to 3 alkenyl groups (although in those cases where the combined total of these molecular chain terminal silicon atom-bonded alkenyl groups across both terminals is less than 3, there is at least one alkenyl group bonded to a non-terminal silicon atom (within the molecular chain) (for example, in the form of a substituent group within a diorganosiloxane unit)) are preferred, and as described above, compounds for which the viscosity at 25° C. is within a range from 10 to 1,000,000 mPa·s are particularly desirable in terms of workability and curability. This straight-chain organopolysiloxane may also include a small quantity of branched structures (trifunctional siloxane units) within the molecular chain.

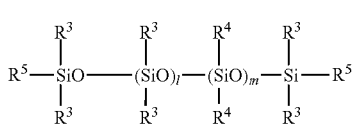
(2)

(wherein, each $R^3$ represents, independently, an identical or different unsubstituted or substituted monovalent hydrocarbon group, of which at least one is an alkenyl group, each $R^4$ represents, independently, an identical or different unsubstituted or substituted monovalent hydrocarbon group that contains no aliphatic unsaturated bonds, $R^5$ represents an alkenyl group, l and m each represent either 0 or a positive integer, and l+m represents a number that yields a viscosity at 25° C. for the organopolysiloxane that falls within a range from 10 to 1,000,000 mPa·s)

The monovalent hydrocarbon group represented by $R^3$ is preferably a group of 1 to 10, and even more preferably 1 to 6, carbon atoms, and specific examples of suitable groups include alkyl groups such as a methyl group, ethyl group, propyl group, isopropyl group, butyl group, isobutyl group, tert-butyl group, pentyl group, neopentyl group, hexyl group, cyclohexyl group, octyl group, nonyl group or decyl group, aryl groups such as a phenyl group, tolyl group, xylyl group or naphthyl group, aralkyl groups such as a benzyl group, phenylethyl group or phenylpropyl group, alkenyl groups such as a vinyl group, allyl group, propenyl group, isopropenyl group, butenyl group, hexenyl group, cyclohexenyl group or octenyl group, and groups in which either a portion of, or all of, the hydrogen atoms within these groups have been substituted with a halogen atom such as a fluorine, bromine or chlorine atom, or a cyano group or the like, including halogen-substituted alkyl groups such as a chloromethyl group, chloropropyl group, bromoethyl group or trifluoropropyl group, and a cyanoethyl group.

The monovalent hydrocarbon group represented by $R^4$ is also preferably a group of 1 to 10, and even more preferably 1 to 6, carbon atoms, and specific examples of suitable groups include the same groups as those listed above in relation to $R^3$, excluding the alkenyl groups.

The alkenyl group represented by $R^5$ is preferably a group of 2 to 6, and even more preferably 2 to 3, carbon atoms, and specific examples of suitable groups include the same groups as those listed above in relation to $R^2$ in the formula (1), and preferably a vinyl group.

l and m are typically either 0 or positive integers that satisfy: $0 < l+m \leq 10,000$, and are preferably integers that satisfy $5 \leq l+m \leq 2,000$ and even more preferably $10 \leq l+m \leq 1,200$, and also preferably satisfy $0 < l/(l+m) \leq 0.2$ and even more preferably $0.001 \leq l/(l+m) \leq 0.1$ Particularly representative examples of the organopolysiloxane of the component (B) include the specific examples shown below.

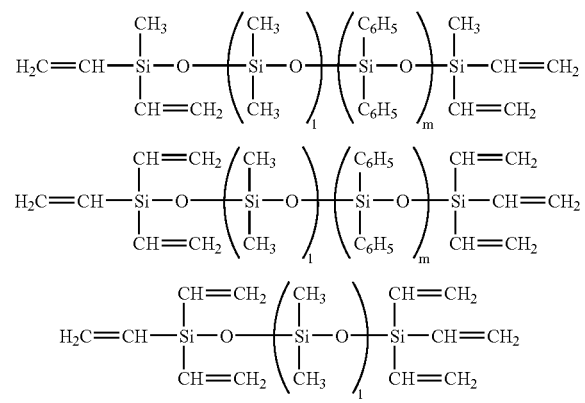

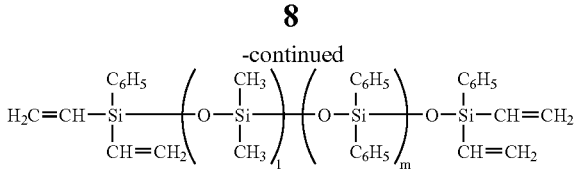

(In the above formulas, l and m are as defined above.)

In addition to the straight-chain organopolysiloxanes described above, organopolysiloxanes with resin structures (that is, three dimensional network structures) can also be used as the component (B), or may also be used in combination with the above type of straight-chain organopolysiloxane.

The above organopolysiloxanes with resin structures (that is, three dimensional network structures) are organopolysiloxanes with resin structures comprising $SiO_2$ units, $R^{30}{}_n R^4{}_p SiO_{0.5}$ units, and $R^{30}{}_q R^4{}_r SiO_{0.5}$ units (where in these formulas, $R^{30}$ represents an alkenyl group such as a vinyl group or allyl group, $R^4$ represents an aforementioned monovalent hydrocarbon group that contains no aliphatic unsaturated bonds, n represents either 2 or 3 and p represents either 0 or 1, although n+p=3, and q represents either 0 or 1 and r represents either 2 or 3, although q+r=3).

Here, if the $SiO_2$ units are termed a units, the $R^{30}{}_n R^4{}_p SiO_{0.5}$ units are termed b units, the $R^{30}{}_q R^4{}_r SiO_{0.5}$ units are termed c units, and the number of mols of each unit are expressed by a, b, and c respectively, then the relative proportions of these units, reported as molar ratios, preferably satisfy: (b+c)/a=0.3 to 3, and particularly 0.7 to 1, and preferably also satisfy: c/a=0.01 to 1, and particularly 0.07 to 0.15. Furthermore, this organopolysiloxane of the component (B) preferably has a polystyrene equivalent weight average molecular weight, determined by gel permeation chromatography (GPC), that falls within a range from 500 to 10,000.

In addition to the aforementioned unit a, unit b, and unit c, this resin structure organopolysiloxane may also include small quantities of bifunctional siloxane units and trifunctional siloxane units (that is, organosilsesquioxane units), provided such inclusion does not impair the objects of the present invention.

This type of resin structure organopolysiloxane can be synthesized readily using conventional methods, by combining the compounds that act as the sources for the various units in the desired molar ratio described above, and then conducting, for example, a cohydrolysis reaction in the presence of an acid. Examples of the source for the aforementioned unit a include sodium silicate, alkyl silicates, polyalkyl silicates, and silicon tetrachloride. Examples of the source for the aforementioned unit b include the compounds shown below.

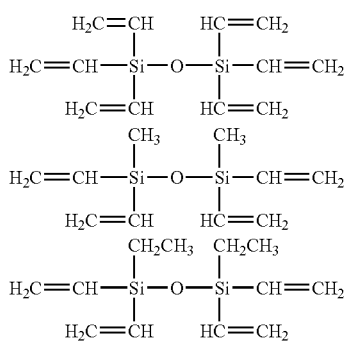

-continued

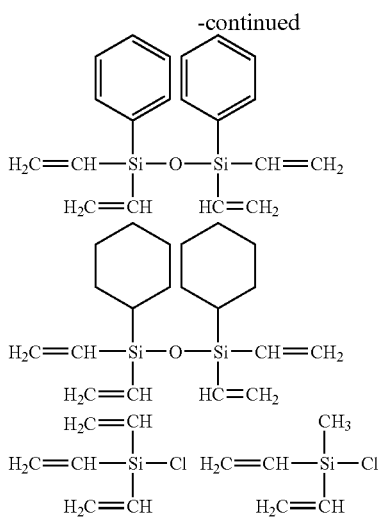

Furthermore, examples of the source for the aforementioned unit c include the compounds shown below.

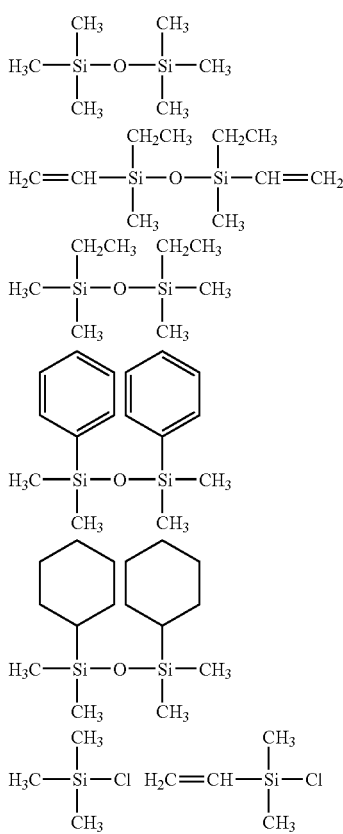

The organopolysiloxane of the component (B) is added to regulate the hardness of the cured product, and as described above, is typically added in a blend quantity within a range from 0.1 to 50 parts by mass per 100 parts by mass of the component (A). A preferred blend quantity is within a range from 1 to 30 parts by mass.

-(C) Organohydrogenpolysiloxane-

The organohydrogenpolysiloxane of the component (C) functions as a cross-linking agent, and the SiH groups within this component undergo an addition reactive (a hydrosilylation) with the alkenyl groups within the component (A) and the component (B), thereby forming the cured product. This organohydrogenpolysiloxane may be any structure that includes two hydrogen atoms bonded to silicon atoms (namely, SiH groups) within each molecule, and although the molecular structure of the organohydrogenpolysiloxane may be a straight-chain, cyclic, branched or three dimensional network structure, the use of structures in which the number of silicon atoms within a single molecule (that is, the polymerization degree) is within a range from 2 to 1,000, and particularly from approximately 2 to 300, is preferred.

There are no particular restrictions on the positions of the silicon atoms to which the hydrogen atoms are bonded, and either the molecular chain terminals or non-terminal positions (within the chain) are suitable. Furthermore, besides the hydrogen atoms, examples of other organic groups bonded to silicon atoms include the same unsubstituted or substituted monovalent hydrocarbon groups that contain no aliphatic unsaturated bonds described in relation to $R^1$ in the above general formula (1).

Examples of the organohydrogenpolysiloxane of the component (C) include the hydrogenorganosiloxanes with the structures shown below.

1,1,3,3-tetramethyldisiloxane

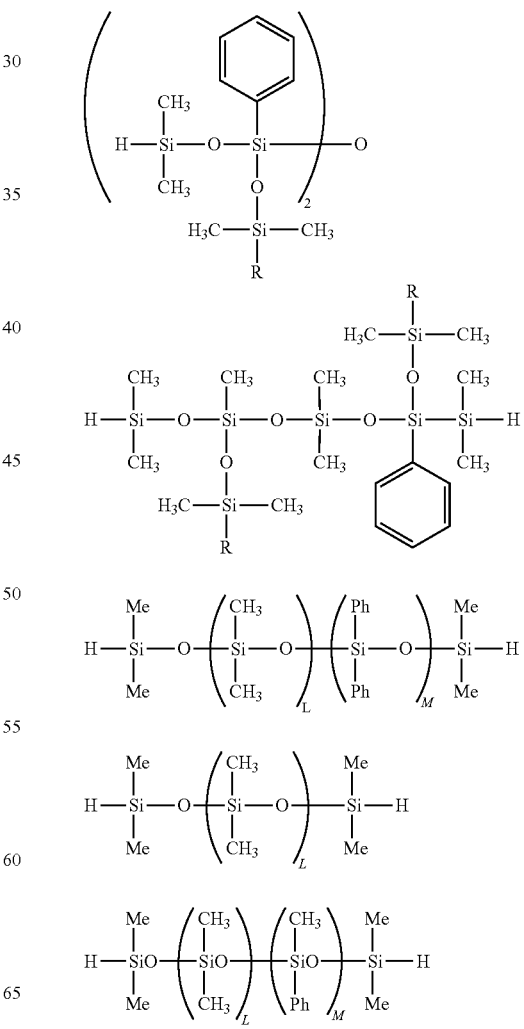

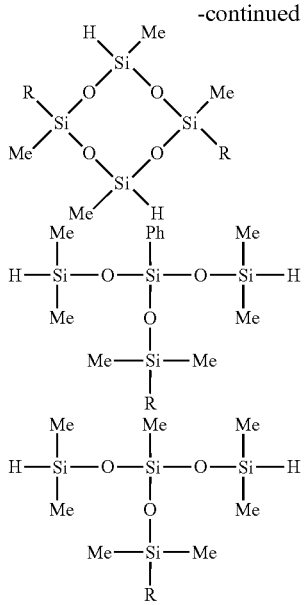

(In the above formulas, R represents at least one organic group selected from an epoxy group, acryloyl group, methacryloyl group, and alkoxy group. L represents an integer from 0 to 1,000, and particularly from 0 to 300, and M represents an integer from 1 to 200.)

These types of organohydrogenpolysiloxanes can be obtained using conventional methods, for example either by conducting a hydrolysis-condensation of a chlorosilane such as $R^5SiHCl_2$, $(R^5)_3SiCl$, $(R^5)_2SiCl_2$ or $(R^5)_2SiHCl$ (wherein $R^5$ represents an alkyl group such as a methyl group or ethyl group, or an aryl group such as a phenyl group), or by conducting a hydrolysis, and then conducting an equilibration of the resulting siloxane.

The blend quantity of this organohydrogenpolysiloxane must be sufficient that the molar ratio of the silicon atom-bonded hydrogen atoms within this component relative to the combined total of silicon atom-bonded alkenyl groups within the component (A) and the component (B) (in other words, the Si—H/Si-alkenyl molar ratio) is 1.0 or greater, and is preferably within a range from 1.0 to 4.0, even more preferably from 1.0 to 3.0, and most preferably from 1.0 to 2.0. If this molar ratio is less than 1.0, then even if the surface of the cured product of the silicone rubber composition (the soft silicone rubber) is coated with a cured product of a curable silicone resin (hard silicone resin) that cures via a hydrosilylation reaction to form a cured product with a type D hardness of 30 or greater, the cross-linking agent of the curable silicone resin penetrates into the interior of the cured silicone rubber, and as a result of reaction with residual alkenyl groups inside the cured silicone rubber, the hardness of the cured silicone rubber increases over time. If this molar ratio is too high, then because large quantities of unreacted SiH groups will remain within the silicone rubber cured product, the physical properties of the cured silicone rubber may alter over time.

-(D) Platinum Group Metal-Based Catalyst-

The platinum group metal-based curing catalyst of the component (D) is added to effect the addition curing reaction of the composition of the present invention, and can use any of the conventional so-called hydrosilylation reaction catalysts. Specific examples of the catalyst include platinum-based, palladium-based and rhodium-based catalysts, although from the viewpoint of factors such as cost, platinum-based catalysts of platinum, platinum black and chloroplatinic acid are preferred, and suitable examples include platinum compounds such as $H_2PtCl_6 \cdot mH_2O$, $K_2PtCl_6$, $KHPtCl_6 \cdot mH_2O$, $K_2PtC4$, $K_2PtCl_4 \cdot mH_2O$, and $PtO_2 \cdot mH_2O$ (wherein, m represents a positive integer), and complexes of these platinum compounds with hydrocarbons such as olefins, alcohols, or vinyl group-containing organopolysiloxanes. These catalysts may be used either alone, or in combinations of two or more different catalysts.

The blend quantity of the catalyst of the component (D) need only be an effective quantity, and a typical quantity, calculated as a (mass referenced) quantity of platinum group metal relative to the combined mass of the aforementioned components (A) through (C), is within a range from 0.1 to 1,000 ppm, and preferably from 0.5 to 200 ppm.

-Other Components-

If required, components other than the components (A) through (D) can also be added to the composition of the present invention. A description of particularly representative optional components is provided below.

-Adhesion Assistant

An adhesion assistant may be added to improve the adhesion of the composition of the present invention to substrates. Examples of preferred adhesion assistants include organosilicon compounds containing a silicon atom-bonded alkoxy group and an alkenyl group or a silicon atom-bonded hydrogen atom (SiH group) within each molecule, as well as organooxysilyl-modified isocyanurate compounds represented by a general formula (3) shown below, and/or hydrolysis-condensation products thereof (namely, organosiloxane-modified isocyanurate compounds).

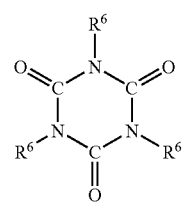

(3)

[wherein, each $R^6$ represents, independently, an organic group represented by a formula (4) shown below:

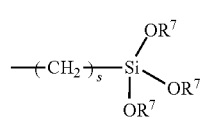

(4)

(wherein, $R^7$ represents a hydrogen atom or a monovalent hydrocarbon group of 1 to 6 carbon atoms, and s represents an integer from 1 to 6, and particularly from 1 to 4), or a monovalent hydrocarbon group that contains an aliphatic unsaturated bond, although at least one of the $R^6$ groups represents an organic group of the formula (4)]

In the formula (3), examples of the monovalent hydrocarbon group containing an aliphatic unsaturated bond represented by $R^6$ include alkenyl groups of 2 to 8 carbon atoms, and particularly of 2 to 6 carbon atoms, such as a vinyl group, allyl group, propenyl group, isopropenyl group, butenyl group, isobutenyl group, pentenyl group, hexenyl group or cyclohexenyl group. Furthermore, examples of the monovalent hydrocarbon group represented by $R^7$ include monovalent hydrocarbon groups of 1 to 8 carbon atoms, and particularly of 1 to 6 carbon atoms, including alkyl groups such as a methyl group, ethyl group, propyl group, isopropyl group, butyl group, isobutyl group, tert-butyl group, pentyl group, hexyl group or cyclohexyl group, the same alkenyl groups as those listed above in relation to $R^6$, such as a vinyl group, allyl group, propenyl group or isopropenyl group, and aryl groups such as a phenyl group.

Specific examples of compounds that can be used as the adhesion assistant include the compounds shown below.

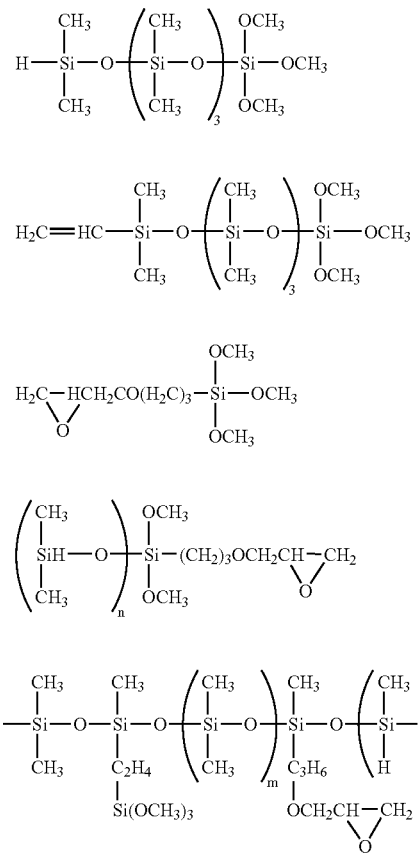

(wherein, m and n each represent, independently, an integer from 0 to 200, although m+n is typically an integer from 2 to 50, and preferably from 4 to 20)

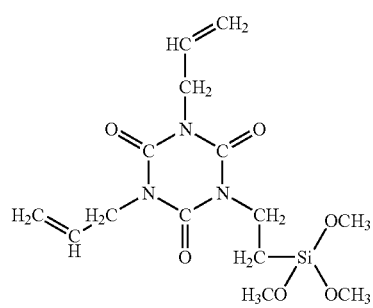

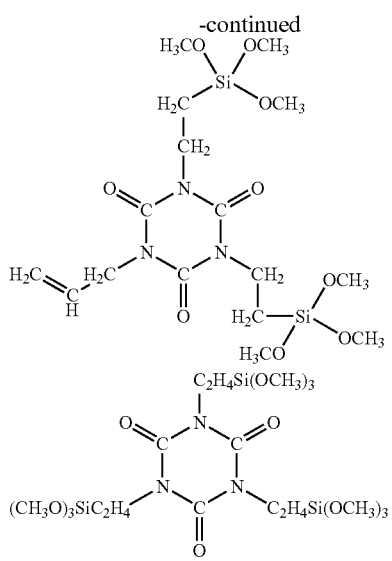

Of these types of organosilicon compounds, organosilicon compounds that contain a silicon atom-bonded alkoxy group and an alkenyl group or a silicon atom-bonded hydrogen atom (SiH group) within each molecule are preferred as they yield cured products with particularly superior adhesion.

The blend quantity of the above adhesion assistant is typically no more than 10 parts by mass (namely, from 0 to 10 parts by mass), preferably from 0.01 to 5 parts by mass, and even more preferably from 0.1 to 1 part by mass per 100 parts by mass of the combination of the components (A), (B), and (C). Blend quantities of the adhesion assistant that are too high can have an adverse effect on the hardness and the surface tackiness of the cured product.

-Curing Retarder

If required, a curing retarder can also be added to the composition of the present invention. Any of the compounds known as hydrosilylation reaction retarders can be used as the curing retarder, and suitable examples include acetylene alcohols. By adding a small quantity of this type of curing retarder to the composition of the present invention, the composition can be prepared as a one-pot composition.

Other optional components can also be added to the composition of the present invention, provided such addition does not impair the actions or effects of the present invention. Examples of these other optional components include inorganic fillers, inorganic phosphors, age resistors, radical inhibitors, ultraviolet absorbers, adhesion improvers, flame retardants, surfactants, storage stability improvers, antiozonants, photostabilizers, thickeners, plasticizers, coupling agents, antioxidants, thermal stabilizers, conductivity imparting agents, antistatic agents, radiation blockers, nucleating agents, phosphorus-based peroxide decomposition agents, lubricants, pigments, metal deactivators, physical property modifiers, and organic solvents. These optional components may be used either alone, or in combinations of two or more different materials.

-Preparation and Curing of Composition

The composition described above can be prepared by mixing together the components (A) through (D) described above, together with any optional components, using a conventional method. The composition can be prepared as either a one-pot or two-pot composition using conventional methods known to those skilled in the art. Following application to a predetermined position on a package, the composition is cured by heating at a temperature within a range from room temperature (23° C.) to 200° C., preferably from 60 to 180° C., and even more preferably from 80 to 160° C.

[Method of Producing Silicone Rubber-Sealed Semiconductor Device]

The addition reaction curable liquid silicone rubber composition of the present invention described above is useful as a semiconductor element sealing material.

Accordingly, the present invention provides a silicone rubber-sealed semiconductor device described above, comprising a semiconductor element, and a cured product of an aforementioned silicone rubber composition (in other words, a silicone rubber cured product or a silicone rubber) that seals the semiconductor element.

In addition, the present invention also provides a silicone rubber-sealed semiconductor device, which exhibits reduced surface tackiness, and in which the surface of the cured product that seals the semiconductor element is coated with a cured silicone resin layer with a thickness of no more than 0.5 mm and a type D hardness prescribed in JIS K6253 of 30 or greater.

Moreover, the present invention also provides a method of producing a semiconductor device with reduced surface tackiness, comprising the steps of:

sealing a semiconductor element with a cured product of the above composition, applying a curable silicone resin, which following curing exhibits a type D hardness prescribed in JIS K6253 of 30 or greater, to the surface of the cured product formed in the above sealing, and curing the applied coating of the curable silicone resin, thereby forming a cured silicone resin layer with a thickness of no more than 0.5 mm.

Examples of suitable semiconductor elements that can be sealed using the present invention include light emitting diodes, photodiodes, CCD, CMOS, image sensors, phototransistors, IR sensors, and laser diodes.

Examples of the curable silicone resin with a type D hardness following curing of 30 or greater that can be used as a coating for reducing the surface tackiness of the silicone rubber cured product include any silicone resins that satisfy the above hardness condition and undergo curing by a hydrosilylation reaction. Of such resins, silicone resins that contain alkenyl groups (and preferably vinyl groups) are particularly desirable. Examples of such alkenyl group-containing silicon resins include resins that contain a silicone resin with a three dimensional structure as the principal component.

Of such resins, particularly representative examples include alkenyl group-containing organopolysiloxanes represented by the formula below:

$(R^8_3SiO_{1/2})_d(R^8_2SiO)_e(R^8_1SiO_{3/2})_f$

[wherein, each $R^8$ represents an identical or different substituted or unsubstituted monovalent hydrocarbon group, although from 2.0 to 45.0 mol % of all the monovalent hydrocarbon groups are alkenyl groups (and preferably vinyl groups) and from 25 to 60 mol % are phenyl groups, d, e, and f represent the relative molar quantities of each of the siloxane units, d/d+e+f=0.65 to 0.95, e/d+e+f=0.05 to 0.35, and f/d+e+f=0 to 0.05].

An organohydrogenpolysiloxane described as the component (C) and a curing catalyst described as the component (D) can be used as a cross-linking agent for this alkenyl group-containing organopolysiloxane.

In the present invention, because a hard silicone resin layer with a thickness of no more than 0.5 mm must be coated onto the surface of the cured product of the curable silicone rubber that functions as the base material, the curable silicone resin composition is usually used in the form of a solution produced by dissolving the resin in an organic solvent with a boiling point of 150° C. or lower. The solvent may be any solvent capable of producing a solution that can be applied uniformly to the surface of the silicone rubber cured product. Of the possible solvents, aromatic hydrocarbon-based solvents such as toluene or xylene, and silicon-based solvents such as trimethyldisiloxane are preferred. In terms of controlling the thickness of the coating, the concentration of the silicone resin composition solution preferably falls within a range from 10 to 90% by mass.

The film thickness of the coating is preferably at least 50 μm but no more than 0.5 mm, and is even more preferably at least 50 μm but no more than 300 μm. Thickness values that are at least 50 μm but no more than 200 μm are particularly desirable.

In those cases where the hardness of the silicone rubber cured product that acts as the base material is low, if the thickness of the coating exceeds 0.5 mm then the coated silicone resin tends to be prone to cracking. Furthermore, if the coating is too thin, it becomes prone to rupture.

There are no particular restrictions on the method used for applying the solution of the curable silicone resin composition, produced by dilution with a solvent in the manner described above, to the surface of the cured silicone rubber cured product, and a uniform application can be achieved by, for example, spray application or immersing the base material in the solution. Following application, by curing the curable silicone resin under predetermined temperature conditions, a silicone rubber cured product with reduced surface tackiness (in other words, a silicone rubber cured product having a cross-linked structure of a specific composition, that has been surface-coated with a silicone resin layer having a specific thickness and a specific hardness) can be obtained.

EXAMPLES

As follows is a more detailed description of the present invention based on a series of examples. In the following description, the units "parts" refers to "parts by mass", and viscosity values refer to values measured at 23° C.

Reference Example 1

-Preparation of Composition

To 80 parts of a dimethylpolysiloxane (VF1) with both molecular chain terminals blocked with vinyldimethylsiloxy groups and with a viscosity of 1 Pa·s were added 15 parts of a dimethylpolysiloxane (VF2) with both molecular chain terminals blocked with vinyldimethylsiloxy groups and with a viscosity of 5 Pa·s, 5 parts of a vinylmethylsiloxane (VMQ) with a resin structure comprising 50 mol % of $SiO_2$ units, 42.5 mol % of $(CH_3)_3SiO_{0.5}$ units and 7.5 mol % of $Vi_3SiO_{0.5}$ units, 12.8 parts of an organohydrogenpolysiloxane represented by a formula (5) shown below:

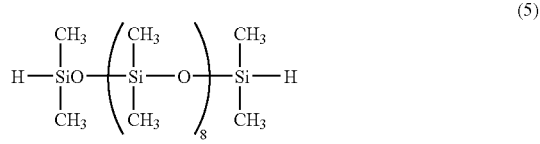

(5)

which provides a SiH group molar quantity equivalent to 1.5 times the combined molar quantity of vinyl groups within the aforementioned VF1, VF2 and VMQ components, and 0.05 parts of an octyl alcohol-modified solution of chloroplatinic acid, thereby completing preparation of a composition.

This composition was evaluated in the manner described below.

-Measurement of Physical Properties of the Uncoated Cured Rubber

The composition obtained above was heat molded for 1 hour at 150° C., yielding a silicone rubber cured product with dimension of 10 mm×50 mm×2 mm (thickness). The tensile strength and elongation of this cured product were measured in accordance with JIS K 6301. The type A hardness was measured in accordance with JIS K6253.

-Formation of Hard Resin Coating

The above cured product was immersed in a 20% by mass toluene solution of a curable silicone resin KJR-632 (a product name, manufactured by Shin-Etsu Chemical Co., Ltd., type D hardness following curing: 70) used for generating a hard, transparent resin, thereby coating the surface of the cured product. Subsequently, the coating film was dried for 1 hour at room temperature, and then cured by heating at 120° C. for 1 hour. The thickness of the coating formed from the hard resin was 200 μm.

-Measurement of Physical Properties of the Coated Cured Rubber

The type A hardness of the silicon rubber cured product 24 hours after coating with the hard resin was measured in the same manner as described above.

-Folding Resistance Test

Even when the cured product of the shape described above that had been surface-coated with the hard resin was folded through 90 degrees, the hard resin coating layer showed no cracking.

-Tackiness Test

Silver powder was sprinkled onto the cured product that had been coated with the hard resin, and onto the uncoated cured product surface, and when air was blown onto the samples in an attempt to remove the silver powder, the silver powder was able to be completely removed from the hard resin-coated sample, whereas in the case of the uncoated sample, a large quantity of the silver powder remained adhered to the surface.

Reference Example 2

In the example 1, with the exceptions of altering the quantity of VF1 (1 Pa·s) to 87.5 parts, altering the addition quantity of VMQ to 2.5 parts, altering the quantity of the organohydrogenpolysiloxane represented by the formula (5) to 8 parts, and also adding 1 part of an epoxy group-containing organohydrogenpolysiloxane represented by a structural formula (6) shown below:

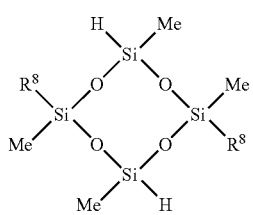

(6)

(wherein, $R^8$ is represented by the formula below),

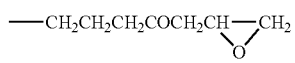

a composition was prepared in the same manner as the example 1.

-Measurement of Physical Properties of the Uncoated Cured Rubber

The thus obtained composition was used to produce a silicone rubber cured product in the same manner as the example 1, and the tensile strength, the elongation, and the type A hardness were measured in the same manner as the example 1. The results are shown in Table 1.

-Formation of Hard Resin Coating

With the exception of not conducting immersion in the 20% solution of KJR632, but rather using spray application, formation of a hard resin coating on the surface of the cured product was conducted in the same manner as the example 1. The thickness of the hard resin coating was 150 μm.

The type A hardness of the silicon rubber cured product 24 hours after coating with the hard resin was also measured in the same manner as the example 1. The result is shown in Table 1.

Furthermore, when the folding resistance test was conducted on the hard resin-coated cured rubber, the hard resin layer showed no cracking.

Furthermore, when the tackiness test was conducted on the hard resin-coated cured rubber and the uncoated cured rubber surface in the same manner as the example 1, the silver powder was able to be completely removed from the hard resin-coated sample, whereas in the case of the uncoated sample, a large quantity of the silver powder remained adhered to the surface.

Example 1

With the exceptions of replacing the epoxy group-containing siloxane used in the example 2 and represented by the formula (6) with 1 part of an epoxy group-containing organohydrogenpolysiloxane represented by a structural formula (7) shown below:

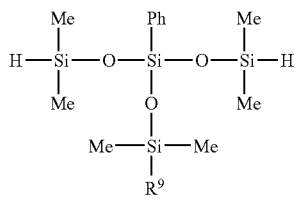

(7)

(wherein, $R^9$ is represented by the formula below),

a composition was prepared in the same manner as the example 2.

-Measurement of Physical Properties of the Uncoated Cured Rubber

The thus obtained composition was used to produce a silicone rubber cured product in the same manner as the example 1, and the tensile strength, the elongation, and the type A hardness were measured in the same manner as the example 1. The results are shown in Table 1.

-Formation of Hard Resin Coating

With the exception of not conducting immersion in the 20% solution of KJR632, but rather using spray application, formation of a hard resin coating on the surface of the cured product was conducted in the same manner as the example 1. The thickness of the hard resin coating was 150 μm.

The type A hardness of the silicon rubber cured product 24 hours after coating with the hard resin was also measured in the same manner as the example 1. The result is shown in Table 1.

Furthermore, when the folding resistance test was conducted on the hard resin-coated cured rubber, the hard resin layer showed no cracking.

Furthermore, when the tackiness test was conducted on the hard resin-coated cured rubber and the uncoated cured rubber surface in the same manner as the example 1, the silver powder was able to be completely removed from the hard resin-coated sample, whereas in the case of the uncoated sample, a large quantity of the silver powder remained adhered to the surface.

Reference Example 3

In the example 1, with the exception of also adding 0.5 parts by mass of an adhesion imparting agent comprising a compound represented by a formula (8) shown below:

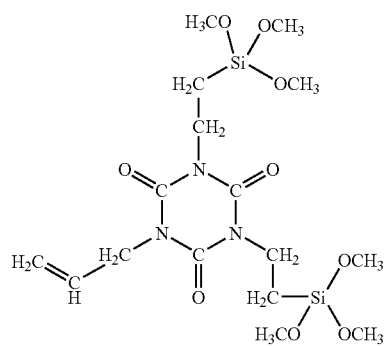

(8)

a composition was prepared in the same manner as the example 1.

-Measurement of Physical Properties of the Uncoated Cured Rubber

The thus obtained composition was used to produce a silicone rubber cured product in the same manner as the example 1, and the tensile strength, the elongation, and the type A hardness were measured in the same manner as the example 1. The results are shown in Table 1.

-Formation of Hard Resin Coating

With the exception of not conducting immersion in the 20% solution of KJR632, but rather using spray application, formation of a hard resin coating on the surface of the cured product was conducted in the same manner as the example 1. The thickness of the hard resin coating was 150 μm.

The type A hardness of the silicon rubber cured product 24 hours after coating with the hard resin was also measured in the same manner as the example 1. The result is shown in Table 1.

Furthermore, when the folding resistance test was conducted on the hard resin-coated cured rubber, the hard resin layer showed no cracking.

Furthermore, when the tackiness test was conducted on the hard resin-coated cured rubber and the uncoated cured rubber surface in the same manner as the example 1, the silver powder was able to be completely removed from the hard resin-coated sample, whereas in the case of the uncoated sample, a large quantity of the silver powder remained adhered to the surface.

Reference Example 4

In the example 2, with the exception of also adding 1.0 parts by mass of an adhesion imparting agent comprising a compound represented by a formula (9) shown below:

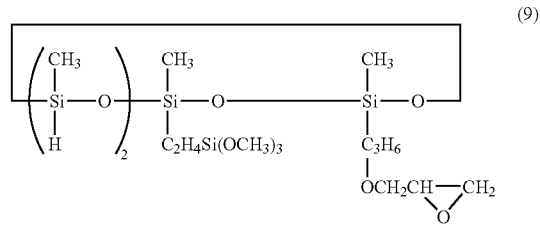

(9)

a composition was prepared in the same manner as the example 2.

The thus obtained composition was used to produce a silicone rubber cured product in the same manner as the example 1, and the tensile strength, the elongation, and the type A hardness were measured in the same manner as the example 1. The results are shown in Table 1.

-Formation of Hard Resin Coating

With the exception of not conducting immersion in the 20% solution of KJR632, but rather using spray application, formation of a hard resin coating on the surface of the cured product was conducted in the same manner as the example 1. The thickness of the hard resin coating was 150 μm.

The type A hardness of the silicon rubber cured product 24 hours after coating with the hard resin was also measured in the same manner as the example 1. The result is shown in Table 1.

Furthermore, when the folding resistance test was conducted on the hard resin-coated cured rubber, the hard resin layer showed no cracking.

Furthermore, when the tackiness test was conducted on the hard resin-coated cured rubber and the uncoated cured rubber surface in the same manner as the example 1, the silver powder was able to be completely removed from the hard resin-coated sample, whereas in the case of the uncoated sample, a large quantity of the silver powder remained adhered to the surface.

Comparative Example 1

In the example 1, with the exception of altering the quantity of the organohydrogenpolysiloxane represented by the formula (5) to 2.7 parts, so that the quantity of silicon atom-bonded hydrogen atoms (SiH) within the composition relative to the combined quantity of vinyl groups within the VF1, VF2 and VMQ components is equivalent to a molar ratio of 0.8, a composition was prepared in the same manner as the example 1.

-Measurement of Physical Properties of the Uncoated Cured Rubber

The thus obtained composition was used to produce a silicone rubber cured product in the same manner as the example 1, and the tensile strength, the elongation, and the type A hardness were measured in the same manner as the example 1. The results are shown in Table 2.

-Formation of Hard Resin Coating

With the exception of not conducting immersion in the 20% solution of KJR632, but rather using spray application, formation of a hard resin coating on the surface of the cured product was conducted in the same manner as the example 1. The thickness of the hard resin coating was 150 μm.

The type A hardness of the silicon rubber cured product 24 hours after coating with the hard resin was also measured in the same manner as the example 1. The result is shown in Table 2.

Furthermore, when the folding resistance test was conducted on the hard resin-coated cured rubber, the hard resin layer showed no cracking.

Furthermore, when the tackiness test was conducted on the hard resin-coated cured rubber and the uncoated cured rubber surface in the same manner as the example 1, the silver powder was able to be completely removed from the hard resin-coated sample, whereas in the case of the uncoated sample, a large quantity of the silver powder remained adhered to the surface.

Comparative Example 2

In the example 1, with the exception of replacing the organohydrogenpolysiloxane represented by the formula (5) with 4.6 parts of a compound represented by a formula (10) shown below:

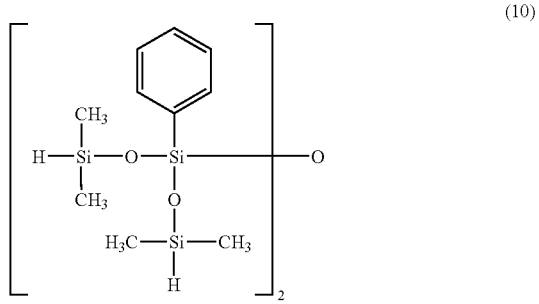

(10)

a composition was prepared in the same manner as the example 1.

-Measurement of Physical Properties of the Uncoated Cured Rubber

The thus obtained composition was used to produce a silicone rubber cured product in the same manner as the example 1, and the tensile strength, the elongation, and the type A hardness were measured in the same manner as the example 1. The results are shown in Table 2.

-Formation of Hard Resin Coating

With the exception of not conducting immersion in the 20% solution of KJR632, but rather using spray application, formation of a hard resin coating on the surface of the cured product was conducted in the same manner as the example 1. The thickness of the hard resin coating was 150 μm.

The type A hardness of the silicon rubber cured product 24 hours after coating with the hard resin was also measured in the same manner as the example 1. The result is shown in Table 2.

Furthermore, when the folding resistance test was conducted on the hard resin-coated cured rubber, the hard resin layer showed no cracking.

Furthermore, when the tackiness test was conducted on the hard resin-coated cured rubber and the uncoated cured rubber surface in the same manner as the example 1, the silver powder was able to be completely removed from the hard resin-coated sample, whereas in the case of the uncoated sample, a large quantity of the silver powder remained adhered to the surface.

Comparative Example 3

In the example 1, with the exception of altering the concentration of the toluene solution of KJR-632, used during hard resin coating of the cured product of the prepared composition, from 20% by mass to 75% by mass, and using this solution to form a hard resin coating with a thickness of 550 μm, a hard resin coating was formed in the same manner as the example 1. When the crack resistance of the thus produced hard resin-coated rubber cured product was measured in the same manner as the example 1, cracks developed in the hard resin layer.

TABLE 1

|  |  | Reference Example 1 | Reference Example 2 | Example 1 | Reference Example 3 | Reference Example 4 |
|---|---|---|---|---|---|---|
| SiH/SiVi (*1) |  | 1.5 | 1.5 | 1.5 | 1.5 | 1.5 |
| External appearance (*2) |  | colorless, transparent | colorless, transparent | colorless, transparent | colorless, transparent | colorless, transparent |
| Curing conditions |  | 150° C./1 hr | 150° C./1 hr | 150° C./1 hr | 150° C./1 hr | 150° C./1 hr |
| Prior to hard resin coating | Tensile strength (MPa) | 0.3 | 0.3 | 0.3 | 0.4 | 0.3 |
|  | Elongation (%) | 300 | 310 | 290 | 230 | 290 |
|  | Hardness (type A) | 8 | 9 | 9 | 11 | 13 |
| Following hard resin coating | Hardness (type A) | 8 | 9 | 9 | 11 | 13 |

(Notes)
(*1): the molar ratio of silicon atom-bonded hydrogen atoms/silicon atom-bonded vinyl groups within the curable silicone rubber composition
(*2): the external appearance of the cured product of the curable silicone rubber composition (prior to coating with the hard resin)

TABLE 2

|  |  | Comparative example 1 | Comparative example 2 |
|---|---|---|---|
| SiH/SiVi (*1) | | 0.8 | 0.8 |
| External appearance (*2) | | colorless, transparent | colorless, transparent |
| Curing conditions | | 150° C./1 hr | 150° C./1 hr |
| Prior to hard resin coating | Tensile strength (MPa) | 0.2 | 0.4 |
| | Elongation (%) | 350 | 200 |
| | Hardness (type A) | 6 | 12 |
| Following hard resin coating | Hardness (type A) | 30 | 45 |

(Notes) *1 and *2 have the same meaning as in Table 1.

Example 6

FIG. 1 is a longitudinal cross-sectional view showing a CCD package 1 in which a semiconductor chip 2 has been sealed. The semiconductor chip 2 is mounted inside a concave section within the package 1, and following bonding of wiring 3 to a lead frame 6, an addition curable liquid silicone rubber composition 4 is injected into, and used to fill, the concave section, and this composition is then cured. Subsequently, a curable silicone resin solution is applied to the top of the silicone rubber cured product 4 and cured, thereby forming a hard resin layer 5, and completing preparation of a silicone rubber-sealed semiconductor device of the present invention.

The silicone rubber compositions prepared in reference examples 1-4, example 1 and the comparative examples 1 and 2 were used as the curable silicone rubber composition, and a toluene solution of KJR-632 that acted as the curable silicone resin solution was applied by spraying so as to form a thin film with a thickness of approximately 200 μm, which was subsequently cured. 20 packages using each composition were thus prepared, and the resulting packages were then subjected to moisture reflow testing in accordance with MSL level 2.

Packages in which cracking occurred in the sealed cured product, or in which the sealed cured product separated from the package or chip surface were evaluated as unsatisfactory. Furthermore, packages in which wire deformation occurred were also evaluated as unsatisfactory. For each example, the ratio of n/20 wherein n is the number of unsatisfactory packages was sought. The results are shown in Table 3.

What is claimed is:

1. A method of reducing surface tackiness of a silicone rubber cured product, comprising:
    coating a surface of a cured product of a curable silicone rubber composition with a curable silicone resin; and
    subsequently curing said silicone resin to form a cured silicone resin layer with a thickness of no more than 0.5 mm, wherein
    said curable silicone rubber composition comprises:
    (A) at least one organopolysiloxane having two alkenyl groups bonded to silicon atoms within each molecule,
    (B) at least one organopolysiloxane having three or more alkenyl groups bonded to silicon atoms within each molecule,
    (C) at least one organohydrogenpolysiloxane having two hydrogen atoms bonded to silicon atoms at the molecular terminals in a form of a dimethylhydrogensiloxy group, having 4 to 302 silicon atoms within each molecule, having $[(C_6H_5)SiO_{3/2}]$ units in the molecule, having a branched structure and further having at least one organic group selected from the group consisting of an epoxy group, an acryloyl group, a methacryloyl group, and an alkoxy group, and
    (D) at least one platinum group metal-based catalyst;
    wherein said silicone rubber composition has a molar ratio of hydrogen atoms bonded to silicon atoms relative to alkenyl groups bonded to silicon atoms of 1.5 to 2.0, and following curing, exhibits a type A hardness prescribed in JIS K6253 of no more than 20;

TABLE 3

| | Reference Example 1 | Reference Example 2 | Example 1 | Reference Example 3 | Reference Example 4 | Comparative example 1 | Comparative example 2 |
|---|---|---|---|---|---|---|---|
| After curing | 0/20 | 0/20 | 0/20 | 0/20 | 0/20 | 0/20 | 0/20 |
| Moisture absorption test | 0/20 | 0/20 | 0/20 | 0/20 | 0/20 | 2/20 | 1/20 |
| 260 reflow/ 1st repetition | 0/20 | 0/20 | 0/20 | 0/20 | 0/20 | 16/20 | 16/20 |
| 260 reflow/ 2nd repetition | 0/20 | 0/20 | 0/20 | 0/20 | 0/20 | 20/20 | 20/20 |
| 260 reflow/ 3rd repetition | 0/20 | 0/20 | 0/20 | 0/20 | 0/20 | | |
| 260 reflow/ 4th repetition | 1/20 | 0/20 | 0/20 | 0/20 | 0/20 | | |
| 260 reflow/ 5th repetition | 1/20 | 0/20 | 0/20 | 0/20 | 0/20 | | |
| Wire deformation | 0/20 | 0/20 | 0/20 | 0/20 | 0/20 | 20/20 | 20/20 | wherein organohydrogenpolysiloxanes present in said curable silicone rubber composition consist of component (C);

said curable silicone resin is a resin that exhibits a type D hardness prescribed in JIS K6253 of 30 or greater in the cured state; and said type D hardness prescribed in JIS K6253 of 30 or greater is a value when a cured layer of said curable silicone resin with a thickness of 6 mm or more is measured according to JIS 6253.

2. The method of reducing surface tackiness of a silicone rubber cured product defined in claim 1, wherein said cured product of said curable silicone rubber composition is formed for sealing a semiconductor.

3. An addition reaction curable liquid silicone rubber composition for sealing a semiconductor, comprising:
(A) at least one organopolysiloxane having two alkenyl groups bonded to silicon atoms within each molecule,
(B) at least one organopolysiloxane having three or more alkenyl groups bonded to silicon atoms within each molecule,
(C) at least one organohydrogenpolysiloxane having two hydrogen atoms bonded to silicon atoms at the molecular terminals in a form of a dimethylhydrogensiloxy group, having 4 to 302 silicon atoms within each molecule, having [$(C_6H_5)SiO_{3/2}$] units in the molecule, having a branched structure, and further having at least one organic group selected from the group consisting of an epoxy group, an acryloyl group, a methacryloyl group, and an alkoxy group, and
(D) at least one platinum group metal-based catalyst, wherein
said composition has a molar ratio of hydrogen atoms bonded to silicon atoms relative to alkenyl groups bonded to silicon atoms of 1.5 to 2.0, and following curing, exhibits a type A hardness prescribed in JIS K6253 of no more than 20; and
organohydrogenpolysiloxanes present in said curable silicone rubber composition consist of component (C).

4. A silicone rubber-sealed semiconductor device, comprising a semiconductor element and a sealing body that seals said semiconductor element, wherein
said sealing body comprises a first sealing member that coats said semiconductor element, and a second sealing member that coats said first sealing member,
said first sealing member comprises a cured product of a curable silicone rubber composition, which comprises:
(A) at least one organopolysiloxane having two alkenyl groups bonded to silicon atoms within each molecule,
(B) at least one organopolysiloxane having three or more alkenyl groups bonded to silicon atoms within each molecule,
(C) at least one organohydrogenpolysiloxane having two hydrogen atoms bonded to silicon atoms at the molecular terminals in a form of a dimethylhydrogensiloxy group, having 4 to 302 silicon atoms within each molecule, having [$(C_6H_5)SiO_{3/2}$] units in the molecule, having a branched structure, and further having at least one organic group selected from the group consisting of an epoxy group, an acryloyl group, a methacryloyl group, and an alkoxy group, and
(D) at least one platinum group metal-based catalyst;
wherein said silicone rubber composition has a molar ratio of hydrogen atoms bonded to silicon atoms relative to alkenyl groups bonded to silicon atoms of 1.5 to 2.0, and upon curing, exhibits a type A hardness prescribed in JIS K6253 of no more than 20;

wherein organohydrogenpolysiloxanes present in said curable silicone rubber composition consist of component (C);

said second sealing member comprises a curable silicone resin layer that has a thickness of no more than 0.5 mm; and said curable silicone resin is a resin that exhibits a type D hardness prescribed in JIS K6253 of 30 or greater in the cured state; and said type D hardness prescribed in JIS K6253 of 30 or greater is a value when a cured layer of said curable silicone resin with a thickness of 6 mm or more is measured according to JIS 6253.

5. A method of producing a silicone rubber-sealed semiconductor device with reduced surface tackiness, comprising:
sealing a semiconductor element with a cured product of an addition reaction curable liquid silicone rubber composition comprising:
(A) at least one organopolysiloxane having two alkenyl groups bonded to silicon atoms within each molecule,
(B) at least one organopolysiloxane having three or more alkenyl groups bonded to silicon atoms within each molecule,
(C) at least one organohydrogenpolysiloxane having two hydrogen atoms bonded to silicon atoms at the molecular terminals in a form of a dimethylhydrogensiloxy group, having 4 to 302 silicon atoms within each molecule, having [$(C_6H_5)SiO_{3/2}$] units in the molecule, having a branched structure, and further having at least one organic group selected from the group consisting of an epoxy group, an acryloyl group, a methacryloyl group, and an alkoxy group, and
(D) at least one platinum group metal-based catalyst, wherein
said silicone rubber composition has a molar ratio of hydrogen atoms bonded to silicon atoms relative to alkenyl groups bonded to silicon atoms of 1.5 to 2.0; and following curing, exhibits a type A hardness prescribed in JIS K6253 of no more than 20, and wherein organohydrogenpolysiloxanes present in said curable silicone rubber composition consist of component (C);

applying a curable silicone resin to a surface of said cured product formed for said sealing, and curing an applied coating of said curable silicone resin, thereby forming a cured silicone resin layer with a thickness of no more than 0.5 mm, wherein said curable silicon resin is a resin that exhibits a type D hardness prescribed in JIS K6253 of 30 or greater in the cured state; and said type D hardness prescribed in JIS K6253 of 30 or greater is a value when a cured layer of said curable silicone resin with a thickness of 6 mm or more is measured according to JIS 6253.

6. The method defined in claim 1, wherein
component (A) comprises a straight-chain organopolysiloxane having one alkenyl group bonded to the silicon atom at each molecular chain terminal and represented by a general formula (1):

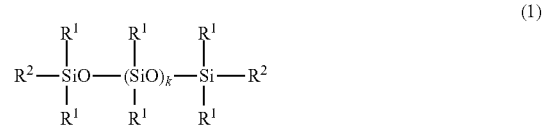

(1)

wherein
each $R^1$ represents, independently, an identical or different unsubstituted or substituted monovalent hydrocarbon group that has no aliphatic unsaturated bonds,
$R^2$ represents an alkenyl group, and
k represents 0 or a positive integer that yields a viscosity at 25° C. for the organopolysiloxane that falls within a range from 10 to 1,000,000 mPa·s; and
component (B) is an organopolysiloxane that has at least three silicon atom-bonded alkenyl groups and has a straight-chain, cyclic, branched or three dimensional network structure.

7. The method defined in claim 1, wherein said curable silicone rubber composition comprises
component (B) in a quantity of 0.1 to 50 parts by mass per 100 parts by mass of component (A),
component (C) in such a quantity that the molar ratio of the silicon atom-bonded hydrogen atoms within this component relative to the combined total of silicone atom-bonded alkenyl groups within component (A) and component (B) is within a range from 1.5 to 2.0, and
component (D) in a quantity calculated as a mass referenced quantity of platinum group metal relative to the combined mass of components (A) through (C) within a range of 0.1 to 1,000 ppm.

8. The method defined in claim 1, wherein said at least one organohydrogenpolysiloxane is selected from the group consisting of

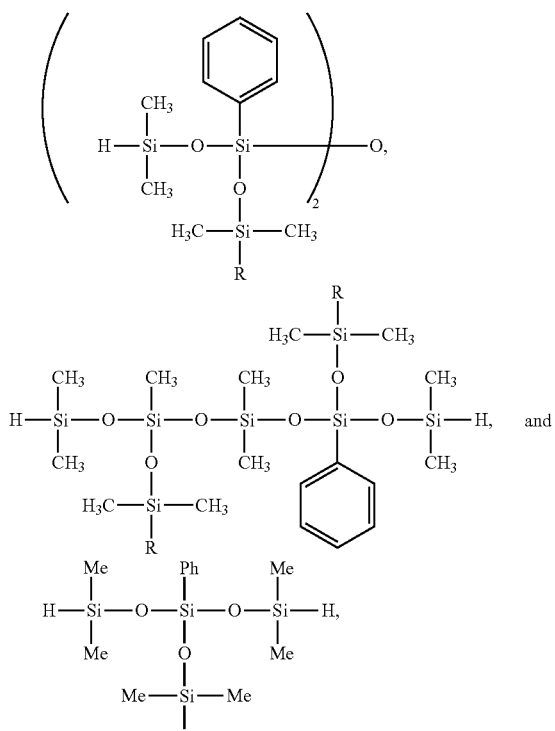

wherein
each R group is selected from the group consisting of an epoxy group, an acryloyl group, a methacryloyl group, and an alkoxy group.

9. The addition reaction curable liquid silicone rubber composition defined in claim 3, wherein component (A) comprises a straight-chain organopolysiloxane having one alkenyl group bonded to the silicon atom at each molecular chain terminal and represented by a general formula (1):

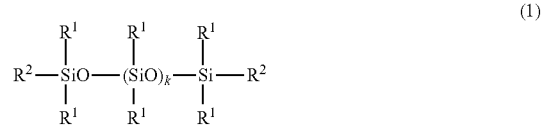

wherein
each $R^1$ represents, independently, an identical or different unsubstituted or substituted monovalent hydrocarbon group that has no aliphatic unsaturated bonds,
$R^2$ represents an alkenyl group, and
k represents 0 or a positive integer that yields a viscosity at 25° C. for the organopolysiloxane that falls within a range from 10 to 1,000,000 mPa·s; and
component (B) is an organopolysiloxane that has at least three silicon atom-bonded alkenyl groups and has a straight-chain, cyclic, branched or three dimensional network structure.

10. The addition reaction curable liquid silicone rubber composition defined in claim 3, wherein said curable silicone rubber composition comprises
component (B) in a quantity of 0.1 to 50 parts by mass per 100 parts by mass of component (A),
component (C) in such a quantity that the molar ratio of the silicon atom-bonded hydrogen atoms within this component relative to the combined total of silicone atom-bonded alkenyl groups within component (A) and component (B) is within a range from 1.5 to 2.0, and
component (D) in a quantity calculated as a mass referenced quantity of platinum group metal relative to the combined mass of components (A) through (C) within a range of 0.1 to 1,000 ppm.

11. The addition reaction curable liquid silicone rubber composition defined in claim 3, wherein said at least one organohydrogenpolysiloxane is selected from the group consisting of

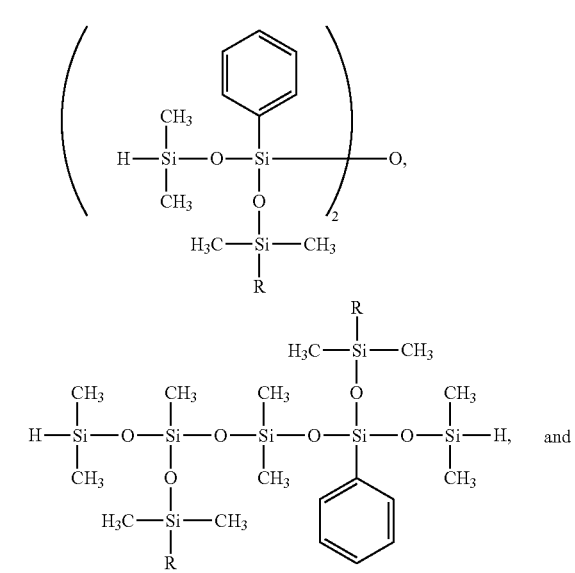

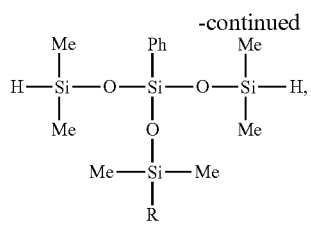

wherein
each R group is selected from the group consisting of an epoxy group, acryloyl group, methacryloyl group, and alkoxy group.

12. The silicone rubber-sealed semiconductor device defined in claim 4, wherein
component (A) comprises a straight-chain organopolysiloxane having one alkenyl group bonded to the silicon atom at
each molecular chain terminal and represented by a general formula (1):

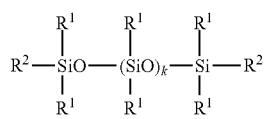 (1)

wherein
each $R^1$ represents, independently, an identical or different unsubstituted or substituted monovalent hydrocarbon group that has no aliphatic unsaturated bonds,
$R^2$ represents an alkenyl group, and
k represents 0 or a positive integer that yields a viscosity at 25° C. for the organopolysiloxane that falls within a range from 10 to 1,000,000 mPa·s; and
component (B) is an organopolysiloxane that has at least three silicon atom-bonded alkenyl groups and has a straight-chain, cyclic, branched or three dimensional network structure.

13. The silicone rubber-sealed semiconductor device defined in claim 4, wherein said curable silicone rubber composition comprises
component (B) in a quantity of 0.1 to 50 parts by mass per 100 parts by mass of component (A),
component (C) in such a quantity that the molar ratio of the silicon atom-bonded hydrogen atoms within this component relative to the combined total of silicone atom-bonded alkenyl groups within component (A) and component (B) is within a range from 1.5 to 2.0, and
component (D) in a quantity calculated as a mass referenced quantity of platinum group metal relative to the combined mass of components (A) through (C) within a range of 0.1 to 1,000 ppm.

14. The silicone rubber-sealed semiconductor device defined in claim 4, wherein said at least one organohydrogenpolysiloxane is selected from the group consisting of

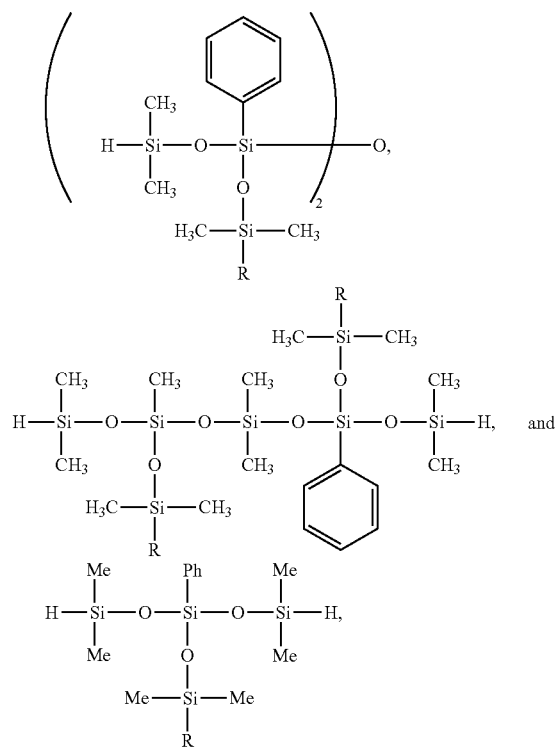

wherein
each R group is selected from the group consisting of an epoxy group, an acryloyl group, a methacryloyl group, and an alkoxy group.

15. The method defined in claim 5, wherein
component (A) comprises a straight-chain organopolysiloxane having one alkenyl group bonded to the silicon atom at each molecular chain terminal and represented by a general formula (1):

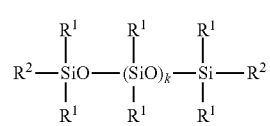 (1)

wherein
each $R^1$ represents, independently, an identical or different unsubstituted or substituted monovalent hydrocarbon group that has no aliphatic unsaturated bonds,
$R^2$ represents an alkenyl group, and
k represents 0 or a positive integer that yields a viscosity at 25° C. for the organopolysiloxane that falls within a range from 10 to 1,000,000 mPa·s; and
component (B) is an organopolysiloxane that has at least three silicon atom-bonded alkenyl groups and has a straight-chain, cyclic, branched or three dimensional network structure.

16. The method defined in claim 5, wherein said curable silicone rubber composition comprises
component (B) in a quantity of 0.1 to 50 parts by mass per 100 parts by mass of component (A),
component (C) in such a quantity that the molar ratio of the silicon atom-bonded hydrogen atoms within this component relative to the combined total of silicone atom-bonded alkenyl groups within component (A) and component (B) is within a range from 1.5 to 2.0, and component (D) in a quantity calculated as a mass referenced quantity of platinum group metal relative to the combined mass of components (A) through (C) within a range of 0.1 to 1,000 ppm.

17. The method defined in claim 5, wherein said at least one organohydrogenpolysiloxane is selected from the group consisting of

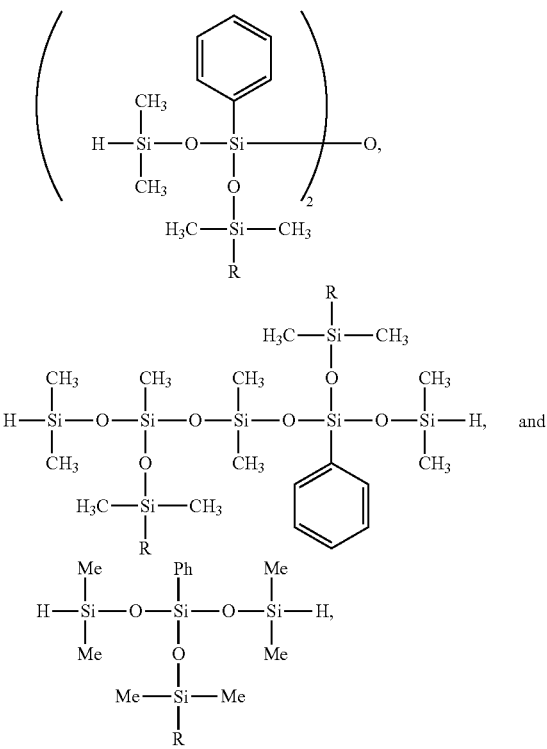

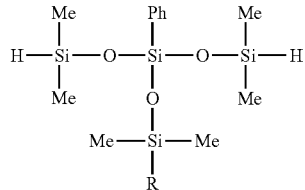

wherein
each R group is selected from the group consisting of an epoxy group, an acryloyl group, a methacryloyl group, and an alkoxy group.

18. The method defined in claim 1, wherein said silicone rubber composition, upon curing, exhibits a type A hardness prescribed in JIS K6253 of from 5 to 18.

19. The method defined in claim 1, wherein said at least one organohydrogenpolysiloxane comprises

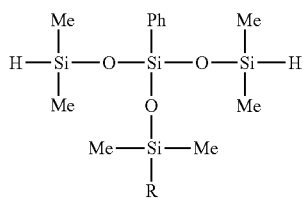

which is present in the silicone rubber composition in such a quantity that the molar ratio of the silicon atom-bonded hydrogen atoms within this component relative to the combined total of silicone atom-bonded alkenyl groups within component (A) and component (B) is within a range from 1.5 to 2.0, and R is an organic group selected from the group consisting of an epoxy group, an acryloyl group, a methacryloyl group, and an alkoxy group.

20. The addition reaction curable liquid silicone rubber composition defined in claim 3, wherein said at least one organohydrogenpolysiloxane comprises

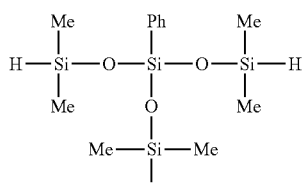

which is present in the silicone rubber composition in such a quantity that the molar ratio of the silicon atom-bonded hydrogen atoms within this component relative to the combined total of silicone atom-bonded alkenyl groups within component (A) and component (B) is within a range from 1.5 to 2.0, and R is an organic group selected from the group consisting of an epoxy group, an acryloyl group, a methacryloyl group, and an alkoxy group.

21. The silicone rubber-sealed semiconductor device defined in claim 4, wherein, wherein said at least one organohydrogenpolysiloxane comprises

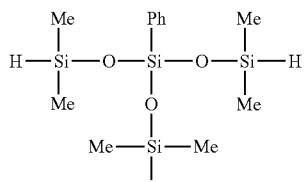

which is present in the silicone rubber composition in such a quantity that the molar ratio of the silicon atom-bonded hydrogen atoms within this component relative to the combined total of silicone atom-bonded alkenyl groups within component (A) and component (B) is within a range from 1.5 to 2.0, and R is an organic group selected from the group consisting of an epoxy group, an acryloyl group, a methacryloyl group, and an alkoxy group.

22. The method defined in claim 5, wherein said at least one organohydrogenpolysiloxane comprises

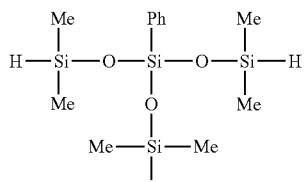

which is present in the silicone rubber composition in such a quantity that the molar ratio of the silicon atom-bonded hydrogen atoms within this component relative to the combined total of silicone atom-bonded alkenyl groups within component (A) and component (B) is within a range from 1.5 to 2.0, and R is an organic group selected from the group consisting of an epoxy group, an acryloyl group, a methacryloyl group, and an alkoxy group.

* * * * *